United States Patent
Kim

(10) Patent No.: US 7,581,146 B2
(45) Date of Patent: Aug. 25, 2009

(54) SEMICONDUCTOR MEMORY DEVICE STORING REPAIR INFORMATION AVOIDING MEMORY CELL OF FAIL BIT OPERATING METHOD THEREOF

(75) Inventor: So Hoe Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 283 days.

(21) Appl. No.: 11/623,222

(22) Filed: Jan. 15, 2007

(65) Prior Publication Data

US 2007/0174744 A1    Jul. 26, 2007

(30) Foreign Application Priority Data

Jan. 25, 2006  (KR) .................... 10-2006-0007819

(51) Int. Cl.
*G01R 31/28* (2006.01)

(52) U.S. Cl. .................... 714/710; 714/718

(58) Field of Classification Search ........... 714/710, 714/776, 735, 736, 718, 819; 365/200, 201, 365/185.09, 185.13, 185.33
See application file for complete search history.

(56) References Cited

U.S. PATENT DOCUMENTS

| 6,181,614 B1 * | 1/2001 | Aipperspach et al. ....... 365/200 |
| 6,400,602 B2 | 6/2002 | Takata et al. |
| 6,668,345 B1 * | 12/2003 | Ooishi et al. ............. 714/710 |

FOREIGN PATENT DOCUMENTS

| JP | 10177799 | 6/1998 |
| JP | 2000011677 | 1/2000 |
| KR | 100191775 | 1/1999 |
| KR | 10-2003-0052659 | 6/2003 |
| KR | 10-2005-0058224 | 6/2005 |

* cited by examiner

*Primary Examiner*—Phung M Chung
(74) *Attorney, Agent, or Firm*—F. Chau & Associates, LLC

(57) ABSTRACT

A semiconductor memory device including a memory array having a plurality of memory cells and a data input/output unit. A part of the memory array is assigned as a repair information region. The repair information region has a plurality of information packets. The data input/output unit reads a first and a second information packet of the plurality of information packets. The second information packet is read according to a link bit address of the first information packet.

20 Claims, 7 Drawing Sheets

US 7,581,146 B2

SEMICONDUCTOR MEMORY DEVICE STORING REPAIR INFORMATION AVOIDING MEMORY CELL OF FAIL BIT OPERATING METHOD THEREOF

CROSS-REFERENCE TO RELATED PATENT APPLICATION

This application claims priority to Korean Patent Application No. 2006-7819, filed on Jan. 25, 2006, in the Korean Intellectual Property Office, the disclosure of which is incorporated by reference herein.

BACKGROUND OF THE INVENTION

1. Technical Field

The present disclosure relates, in general, to semiconductor memory devices and, more particularly, to a semiconductor memory device for storing repair information about a memory cell.

2. Discussion of the Related Art

Typically, a semiconductor memory device includes a memory array having a memory cell arranged in a matrix of bit lines and word lines. The memory array also includes redundancy cells that can be substituted for defective memory cells. By replacing a memory cell having a defect with a redundancy cell, a semiconductor memory device can operate normally. Repair information is commonly stored in the semiconductor memory device.

Technology to record repair information for a memory cell in a memory array was recently developed to reduce chip size. FIG. 1 illustrates a method of storing repair information in a conventional semiconductor memory device. Referring to FIG. 1, memory array 10 includes a normal block 11 and a redundancy block 13. In the normal block 11 and the redundancy block 13, although not shown, memo cells and redundancy cells are disposed at the intersection of word lines WL and bit lines BL. A section of the normal block 11 is assigned as a repair information region 15 to store repair information. The repair information region 15 is assigned at an area corresponding to the word lines WL of the normal block 11 to improve read speed. The repair information region 15 shares bit lines BL with memory cells storing normal data.

Repair information is stored at the memory cell of any bit of the repair information region 15. For example, when bit lines F_BL1 and F_BL2, which correspond to a memory cell 15a storing the repair information, are defective, the repair information cannot be stored correctly.

SUMMARY OF THE INVENTION

According to an exemplary embodiment of the present invention, there is provided a semiconductor memory device which includes a memory array having a plurality of memory cells and a data input/output unit. A part of the memory array is assigned as a repair information region. The repair information region has a plurality of information packets. The data input/output unit reads a first and a second information packet of the plurality of information packets. The second information packet is read according to a link bit address of the first information packet.

According to an exemplary embodiment of the present invention, there is provided a method of operating a semiconductor memory device having a memory array including a plurality of memory cells. The method include includes the steps of assigning a part of the memory array into a repair information region, subdividing the repair information region into a first information packet and a second information packet, wherein each of the first and second information packets includes a fail bit address and a linking bit address, searching the memory cells to determine a first bit address and a second bit address of the memory cells which are defective in the memory array, storing the first bit address into the fail bit address of the first information packet, storing the second bit address into the fail bit address of the second information packet, and storing the second bit address into the linking bit address of the first information packet. The first and second information packets may further include a redundancy bit address that indicates a bit address of a redundancy cell for replacing a memory cell which is, defective in the memory array.

According to an exemplary embodiment of the present invention, there is provided a method of operating a semiconductor memory device having a memory array including a plurality of memory cells. The method includes the steps of reading a first information packet stored in a repair information region of the memory array, and reading a second information packet according to a link bit address of the first information packet. The method may further comprise the step of storing a first fail bit address of the first information packet and storing a second fail bit address of the second information packet.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EXEMPLARY EMBODIMENTS

Figure 1:
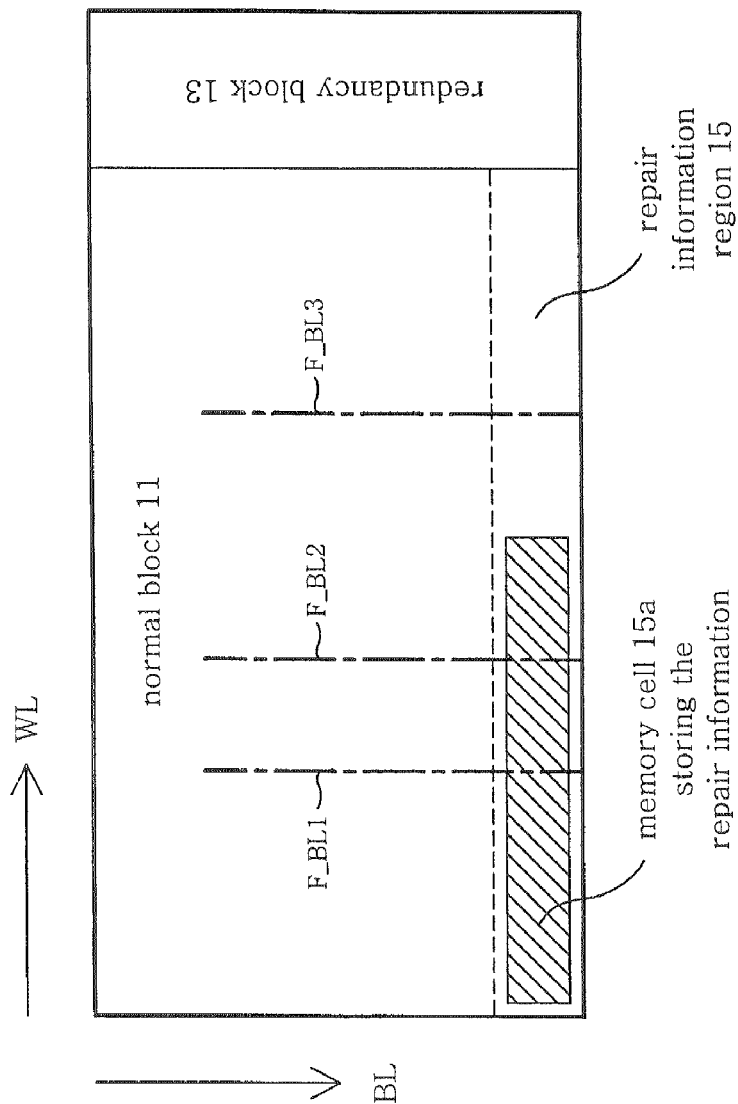
FIG. 1 illustrates a method of storing repair information in a conventional semiconductor memory device.

The same reference numerals are used throughout the different drawings to designate the same or similar components. Hereinafter, exemplary embodiments of the present invention will be described in detail with reference to the attached draw rings.

Figure 2:
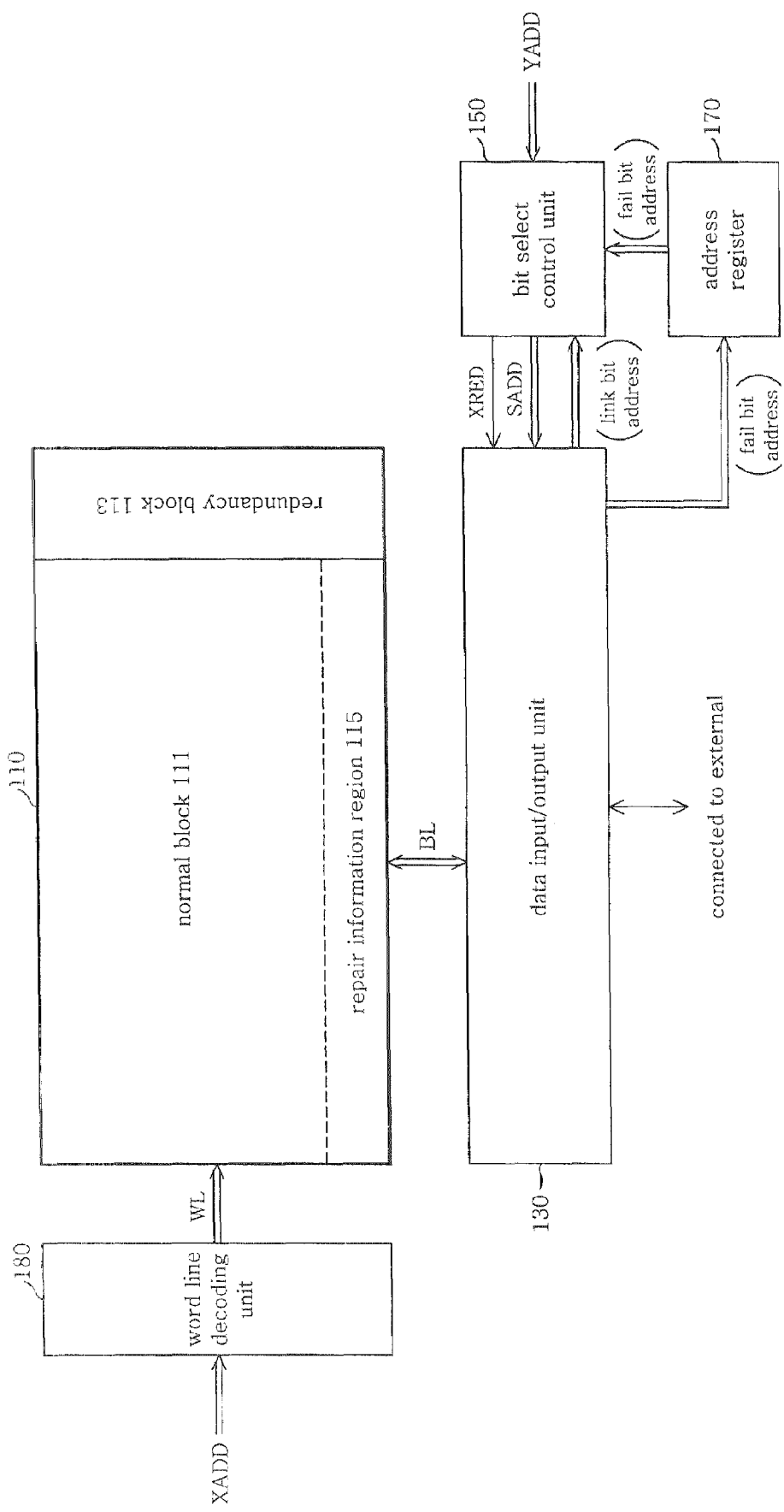
FIG. 2 illustrates a semiconductor memory device according to an exemplary embodiment of the present invention.

FIG. 2 illustrates a semiconductor memory device according to an exemplary embodiment of the present invention. Referring to FIG. 2, the semiconductor memory device includes a memory array 110 and a data input/output unit 130.

The memory array 110 includes a normal block 111 and a redundancy block 113. In the normal block 111, although not illustrated in the drawing, memory cells are disposed at an intersection of word lines WL and bit lines BL.

In the redundancy block 113, although also not illustrated in the drawing, redundancy cells to replace the memory cells of the normal block 111 are disposed.

The normal block 111 may include a repair information region 115 for storing repair information. The repair information region 115 may be disposed along a word line WL of the normal block 111 in consideration of optimizing a reading rate of data stored. Accordingly, memory cells of the repair information region 115 share the bit lines BL with memory cells of the normal block 111.

Figure 3:
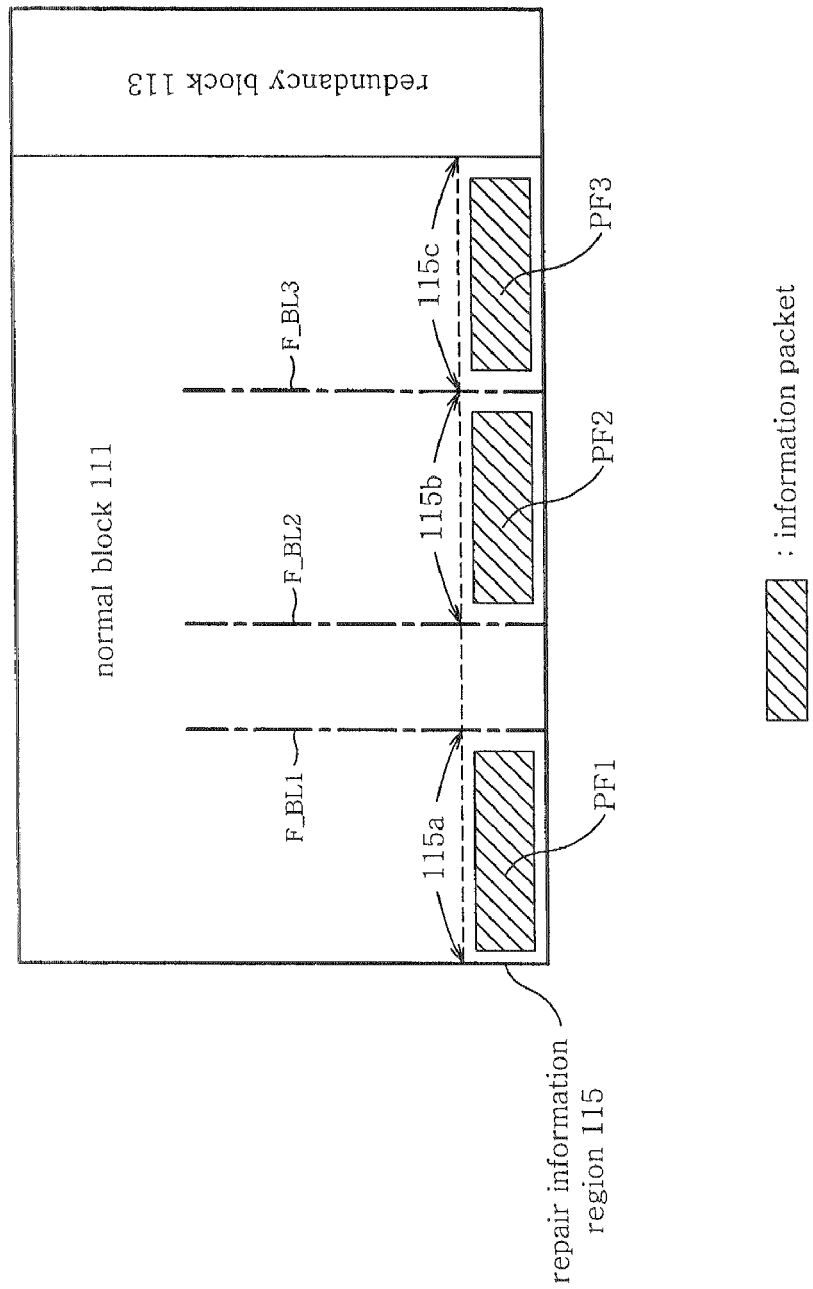
FIG. 3 illustrates a method of storing repair information in a semiconductor memory device according to an exemplary embodiment of the present invention.

FIG. 3 illustrates a method of storing repair information in a semiconductor memory device according to an exemplary embodiment of the present invention. Referring to FIG. 3, the repair information region 115 includes a plurality of information packets PF1, PF2, PF3 where repair information can be stored. The information packets PF1, PF2, PF3 are stored at recordable bit sections 115a, 115b, 115c of the repair information region 115.

Each of the recordable bit sections 115a, 115b, 115c has a number of consecutive non-fail bits which is equal to or greater than a number of permissible bits. The term 'non-fail bit' means a bit without a defect in itself and in a corresponding bit line BL. The 'permissible bit' depends on the number of bits of the information packets PF1, PF2, PF3. The 'permissible bit' may be the highest numbered bit among the bit numbers of the information packets PF1, PF2, PF3.

Figure 4:
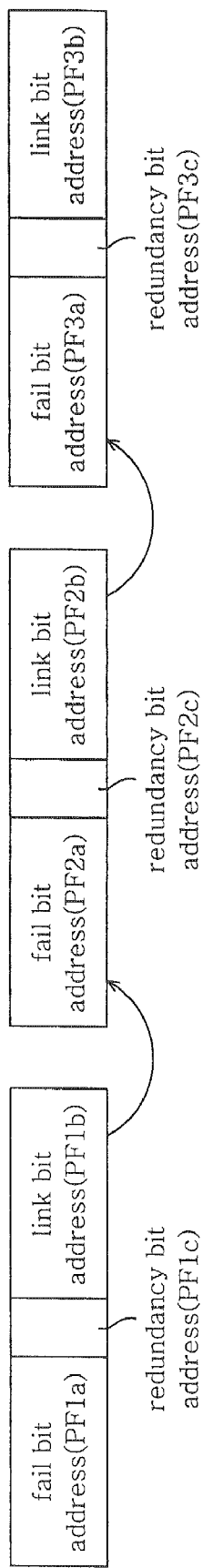
FIG. 4 illustrates an exemplary embodiment of the information packets PF1, PF2, and PF3 of FIG. 3.

FIG. 4 illustrates an exemplary embodiment of the information packets PF1, PF2, PF3 of FIG. 3. Referring to FIG. 4, each of the information packets PF1, PF2, PF3 includes fail bit addresses PF1a, PF2a, PF3a and link bit addresses PF1b, PF2b, PF3b. However, the information packet PF3 which is linked at the end, may not contain the link bit address PF3b.

The fail bit addresses PF1a, PF2a, PF3a, indicate that a bit address (column address) of a memory cell is defective in the normal block 111. The link bit addresses PF1b, PF2b, PF3b indicate a bit address of memory cells storing the information packet being linked.

As shown in FIG. 4, the link bit address PF1b of the first information packet PF1 indicates the bit address of memory cells storing the second information packet PF2. Further, the link bit address PF2b of the second information packet PF2 indicates the bit address of memory cells storing the third information packet PF3.

Each of the information packets PF1, PF2, PF3 may further include redundancy bit addresses PF1c, PF2c, PF3c. The redundancy bit addresses PF1c, PF2c, PF3c are addresses that specify a bit line BL of the redundancy cell of the redundancy block 113 (refer to FIG. 2). When redundancy bit addresses are used, the information packets PF1, PF2, PF3 indicate that the memory cells of fail bit addresses PF1a, PF2a, PF3a are to be replaced with redundancy cells of the redundancy bit addresses PF1c, PF2c, is PF3c.

Referring to FIG. 2, the data input/output unit 130 reads the first information packet PF1 and operates to read the second information packet according to the link bit address PF1b of the first information packet PF1. Further, the data input/output unit 130 operates to read the third information packet PF3 according to the link bit address PF2b of the second information packet PF2.

In an exemplary embodiment of the present invention, the semiconductor memory device includes a bit select control 150 and an address register 170. The bit select control 150 receives one of the link bit addresses PF1b, PF2b, PF3b from a corresponding one of the information packets PF1, PF2, PF3 that are read. The bit select control 150 controls the data input/output unit 130 to select a bit having one of the information packets PF2, PF3 which are linked according to the link bit addresses PF1b, PF2b.

The address register 170 stores one of the fail bit addresses PF1a, PF2a, PF3a of the corresponding information packets PF1, PF2, PF3 supplied from the data input/output unit 130. When memory cells of the memory array 110 are non-volatile memory cells, the address register 170 is not disposed in the semiconductor memory device and the data input/output unit 130 directly reads the information packet stored in the memory cell of the repair information region 115. The defective memory cell of the normal block 111 is replaced with the redundancy cell of the redundancy block 113.

Figure 5:
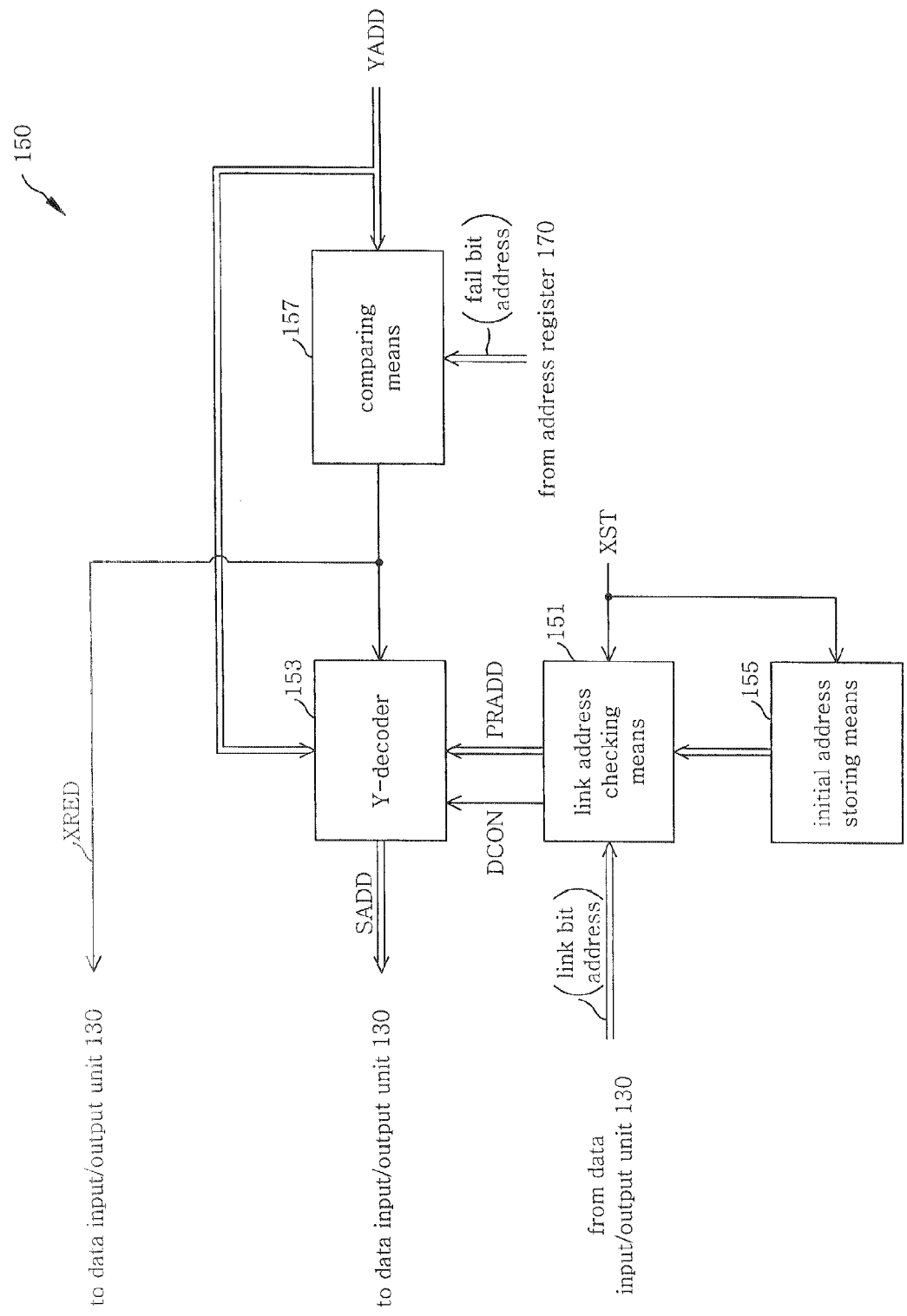
FIG. 5 illustrates an exemplary embodiment of the bit select control unit 150 of FIG. 2.

FIG. 5 illustrates an exemplary embodiment of the bit select control unit 150 of FIG. 2. Referring to FIG. 5, the bit select control unit 150 comprises a ink address checking means 151 and an Y-decoder 153. A Y-decoder is used for decoding a bit line or a column address.

The link address checking means 151 receives one of the link bit addresses PF1b, PF2b, PF3b of a corresponding one of the information packets PF1, PF2, PF3 read. The link address checking means 151 also provides a corresponding one of the link bit addresses PF1b, PF2b, PF3b to the Y-decoder 153 as a process address PRADD.

The link address checking means 151 provides a decoder control signal DCON to the Y-decoder 153. The decoder control signal DCON becomes enabled in response to a start control signal XST. When the information packet being read is the last information packet, the information packet becomes disabled.

The Y-decoder 153 provides a select address SADD to the data input/output unit 130. The data input/output unit 130 is operated to select a memory cell according to the select address SADD. During the activation of the decoder control signal DCON, the select address SADD is controlled to correspond to the process address PRADD.

When the decoder control signal DCON is not active, the Y-decoder 153 is operated to generate the select address SADD, according to a Y-address YADD. A Y-address is a column address for decoding a bit line.

According to an exemplary embodiment of the present invention, the bit select control unit 150 further comprises an initial address storing means 155. The initial address storing means 155 stores an initial address STADD which indicates the address of a memory cell that stores a specific information packet. As an example, the initial address STADD may indicate the bit address of a memory cell storing the first information packet PF1.

The initial address storing means 155 provides the initial address STADD to the Y-decoder 153 in response to the start control signal XST. When this occurs, the link address checking means 151 provides the initial address SADD as the process address PRADD in response to the start control signal XST.

The bit select control unit 150 further includes a comparing means 157'. The comparing means 157 compares the Y-address YADD with one of the bit addresses PF1a, PF2a, PF3a (refer to FIG. 4) stored at the address register 170 (refer to FIG. 2). The comparing means 157 also generates a redundancy enable signal XRED. The redundancy enable signal XRED is activated when the Y-address YADD corresponds to one of the fail bit addresses PF1a, PF2a, PF3a.

If the redundancy enable signal XRED is activated, the Y-decoder 153 becomes disabled and the data input/output unit 130 (refer to FIG. 2) is operated to select a redundancy cell of the redundancy block 113 to replace the memory cell of the normal block 111.

In FIG. 2, a word line decoding unit 180 decodes an externally provided X-address, and drives one of the word lines WLs. An X-address is a row address for decoding a word line.

Figure 6:
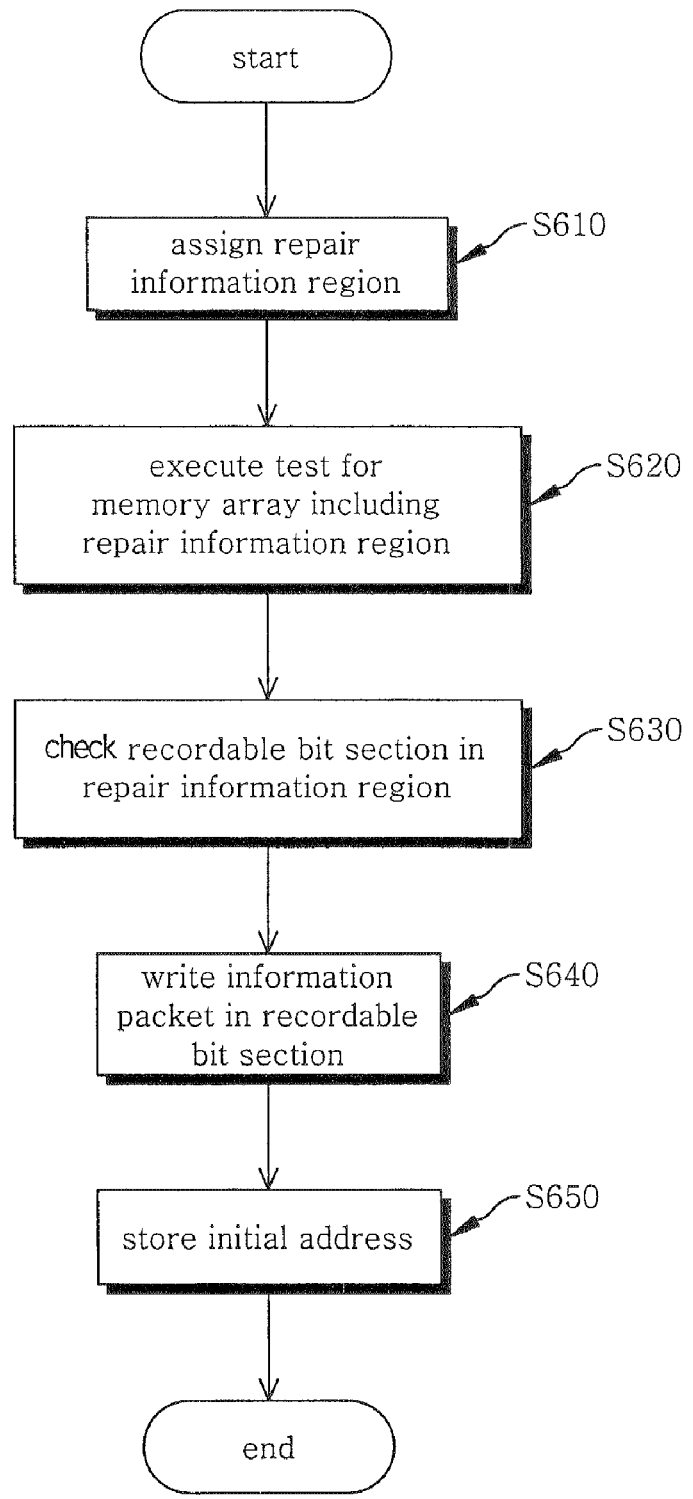
FIG. 6 is a flow chart which illustrates a method of storing the information packets PF1, PF2, PF3 at a repair information region, according to an (exemplary embodiment of the present invention.

FIG. 6 is a flow chart which illustrates a method of storing information packets PF1, PF2, PF3 at a repair information region, according to an exemplary embodiment of the present invention.

Referring to FIG. 6, at a step of S610, the repair information region 115 for storing the information packets PF1, PF2, PF3 is assigned at the memory array 110.

At a step S620, a test is executed for the memory 110 and the repair information region 115 to search for the memory cell and the bit line with a defect.

At a step of S630, the recordable bit sections 115a, 115b, 115c in the repair information region 115 are checked.

At a step of S640, the information packets PF1, PF2, PF3 are written in the recordable bit sections 115a, 115b, 115c of the repair information region 115.

At a step of S650, the initial address STADD is stored in the initial address storing means 155.

Accordingly, the information packets PF1, PF2, PF3 can be stored in the memory cell of the repair information region 115, which has no defect in a corresponding bit line BL as well as in itself.

Figure 7:
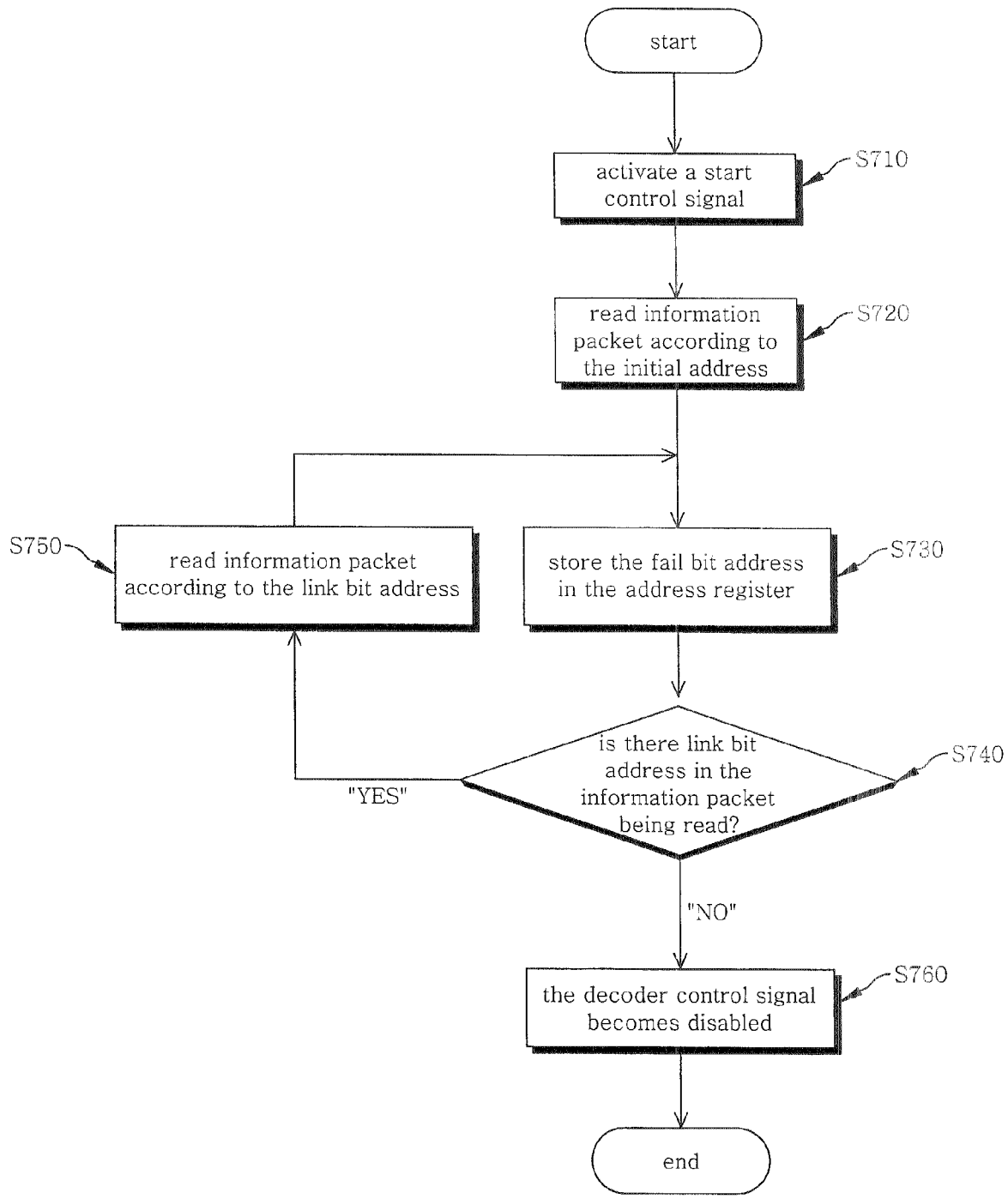
FIG. 7 is a flow chart which illustrates a method of storing the fail bit addresses PF1a, PF2a, PF3a of FIG. 4 in the address register 170 of FIG. 2, according to an exemplary embodiment of the present invention.

FIG. 7 is a flow chart which illustrates a method of storing the fail bit addresses PF1a, PF2a, PF3a of FIG. 4 in the address register 170 of FIG. 2, according to an exemplary embodiment of the present invention.

Referring to FIG. 7, at a step of S710, the start control signal XST is activated and then the initial address STADD stored in the initial address storing means 155 is provided to the link address checking means 151.

At a step of S720, the information packet PF1 is read by the data input/output unit 130, according to the initial address STADD.

At a step of S730, the fail bit address PF1a of the information packet PF1 read, is stored in the address register 170.

At a step of S740, whether there is a link bit address PF1b in the information packet PF1, is determined.

If the link bit address PF1b is present in the information packet PF1, at a step of S750, the information packet PF2 is read according to the link bit address PF1b. Then, the step of S730 is executed again and the fail bit address PF2a of the information packet PF2 is stored in the address register 170.

If there is no link bit address in the information packet, at a step S760, the decoder control signal DCON becomes disabled.

Accordingly, the fail bit addresses PF1a, PF2a, PF3a of the information packets PF1, PF2, PF3 stored in the recordable bit sections 115a, 115b, 115c can be stored in the address register 170.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
   a memory array including a plurality of memory cells, wherein a part of the memory array is assigned as a repair information region, the repair information region having a plurality of information packets; and
   a data input/output unit which reads a first information packet of the plurality of information packets and reads a second information packet of the plurality of information packets according to a link bit address of the first information packet if the link bit address indicating a bit address of memory cells storing the second information packet is present in the first information packet.

2. The semiconductor memory device of claim 1, further comprising:
   a bit select control unit controlling the data input/output unit to select a bit of the second information packet.

3. The semiconductor memory device of claim 1, further comprising:
   an address register for storing fail bit addresses of information packets of the plurality of information packets which are provided by the data input/output unit.

4. The semiconductor memory device of claim 1, wherein the memory cells are non-volatile.

5. The semiconductor memory device of claim 1, further comprising:
   a bit select control unit controlling the data input/output unit to select a bit of the second information packet, wherein the bit select control unit comprises:
      a link address checking means receiving the link bit address of the first information packet, the link address checking means providing a process address derived from the link bit address; and
      a Y-decoder providing a select address to the data input/output unit to select a memory cell of the plurality of memory cells, wherein the select address corresponds to the process address.

6. The semiconductor memory device of claim 5, wherein the bit select control unit further comprises an initial address storing means for storing an initial address that designates a bit address of a memory cell of the plurality of memory cells storing the first information packet, wherein the link address checking means provides the initial address as the process address in response to a start control signal.

7. The semiconductor memory device of claim 5, wherein the bit select control unit further comprises an address register for storing a fail bit address of an information packet provided by the data input/output unit.

8. A semiconductor memory device, comprising:
   a memory array including a plurality of memory cells, wherein a part of the memory array is assigned as a repair information region, the repair information region having a plurality of information packets; and
   a data input/output unit which reads a first information packet of the plurality of information packets and reads a second information packet of the plurality of information packets according to a link bit address of the first information packet; and
   a bit select control unit controlling the data input/output unit to select a bit of the second information packet, wherein the bit select control unit comprises:
      a link address checking means receiving the link bit address of the first information packet, the link address checking means providing a process address derived from the link bit address; and
      a Y-decoder providing a select address to the data input/output unit to select a memory cell of the plurality of memory cells, wherein the select address corresponds to the process address.

9. The semiconductor memory device of claim 8, wherein the bit select control unit further comprises an initial address storing means for storing an initial address that designates a bit address of a memory cell of the plurality of memory cells storing the first information packet, wherein the link address checking means provides the initial address as the process address in response to a start control signal.

10. The semiconductor memory device of claim 8, wherein the bit select control unit further comprises an address register for storing a fail bit address of an information packet provided by the data input/output unit.

11. The semiconductor memory device of claim 10, wherein the bit select control unit further comprises a comparing means for generating a redundancy enable signal with respect to a Y-address which corresponds to the fail bit address stored at the address register, wherein the data input/output unit operates to select a redundancy cell for replacing the memory cell of the memory array in response to the redundancy enable signal.

12. The semiconductor memory device of claim 11, wherein the Y-decoder becomes disabled in response to the redundancy enable signal.

13. A method of operating a semiconductor memory device having a memory array including a plurality of memory cells, comprising the steps of:
    assigning a part of the memory array into a repair information region;
    subdividing the repair information region into a first information packet and a second information packet, wherein each of the first and second information packets comprise a fail bit address and a linking bit address;
    searching the memory cells to determine a first bit address and a second bit address of the memory cells which are defective in the memory array;
    storing the first bit address into the fail bit address of the first information packet;
    storing the second bit address into the fail bit address of the second information packet; and
    storing the second bit address into the linking bit address of the first information packet.

14. The method of claim 13, wherein each of the first and second information packets further comprises a redundancy bit address that indicates a bit address of a redundancy cell for replacing a memory cell which is defective in the memory array.

15. The method of claim 13, further comprising the step of:
    storing an initial address, wherein the initial address designates a bit address of a memory cell storing the first information packet.

16. The method of claim 13, wherein the memory cells are non-volatile.

17. A method of operating a semiconductor memory device having a memory array including a plurality of memory cells, wherein a part of the memory array is assigned as a repair information region, the repair information region having a plurality of information packets, the method comprising the steps of:
    reading a first information packet of the plurality of information packets stored in the repair information region of the memory array;
    determining whether a link bit address indicatin2 a bit address of a memory cell storing a second information packet of the plurality of information packets is present in the first information packet or not; and
    reading a second information packet, according to the link bit address of the first information packet, if the link bit address is present in the first information packet.

18. The method of claim 17, further comprising the step of:
    storing a first fail bit address of the first information packet and storing a second fail bit address of the second information packet.

19. The method of claim 17, wherein the reading of the first information packet is executed according to an initial address.

20. The method of claim 17, wherein the memory cells are non-volatile.

* * * * *